(12) United States Patent
Kim et al.

(10) Patent No.: US 8,035,238 B2
(45) Date of Patent: Oct. 11, 2011

(54) DRIVING CIRCUIT AND LIQUID CRYSTAL DISPLAY DEVICE INCLUDING THE SAME

(75) Inventors: Min-Hwa Kim, Gyeongsangbuk-do (KR); Jin-Cheol Hong, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 638 days.

(21) Appl. No.: 11/641,789

(22) Filed: Dec. 20, 2006

(65) Prior Publication Data

US 2007/0284763 A1    Dec. 13, 2007

(30) Foreign Application Priority Data

Jun. 7, 2006   (KR) .................. 10-2006-0050852

(51) Int. Cl.
*H01L 23/29*   (2006.01)
(52) U.S. Cl. ................... 257/797; 257/E23.065

(58) Field of Classification Search .................. 257/668, 257/690, 692, 688, 701, 659, E23.065, 797; 349/149, 151
See application file for complete search history.

(56) References Cited

U.S. PATENT DOCUMENTS 6,050,830 A * 4/2000 Tanaka ............................ 439/67
6,266,119 B1 * 7/2001 Takahashi et al. ............. 349/149

* cited by examiner

*Primary Examiner* — Hoa B Trinh
(74) *Attorney, Agent, or Firm* — Morgan, Lewis & Bockius LLP

(57) ABSTRACT

A tape carrier package (TCP) includes a film, a plurality of output leads and a plurality of input leads on the film, the plurality of output leads and the plurality of input leads being disposed on different sides, first and second TCP alignment marks arranged on opposing sides of the plurality of output leads, and a third TCP alignment mark at a central portion of the plurality of output leads.

5 Claims, 9 Drawing Sheets

DRIVING CIRCUIT AND LIQUID CRYSTAL DISPLAY DEVICE INCLUDING THE SAME

This application claims the benefit of the Korean Patent Application No. 2006-0050852 filed on Jun. 7, 2006, which is hereby incorporated by reference.

BACKGROUND OF THE INVENTION

1. Field of the Invention

The present invention relates to a liquid crystal display (LCD) device, and more particularly to a driving circuit for driving the same.

2. Discussion of the Related Art

A liquid crystal display (LCD) device includes an array substrate, a color filter substrate facing and spaced apart from the array substrate, and a liquid crystal layer disposed between the array substrate and the color filter substrate. The array substrate includes a gate line and a data line crossing each other. A thin film transistor (TFT) is connected to the gate line and the data line. The color filter substrate includes a color filter layer and a common electrode.

The LCD device further includes a driving circuit. The driving circuit may be connected to the array substrate according to various attaching processes, such as a tape automated bonding (TAB) method and a chip on glass (COG) method. The structure of the LCD device according to the COG method is relatively simple since the driving circuit directly contacts the array substrate. However, as the size of the LCD device increases, it becomes more difficult to attach the driving circuit to the array substrate. In the TAB method, since the driving circuit is formed on a film of a tape carrier package (TCP), the bonding process is simple. However, an effective area of the array substrate is enlarged. Currently, the TAB method has been widely used as a bonding method of the driving circuit.

In a TAB method, the driving circuit is formed as a driving integrated circuit (IC) and the TCP has input and output leads on the film. The driving IC is attached to inner portions of the input and output leads of the TCP film using a bump through an inner lead bonding (ILB) process. Outer portions of the output leads are attached to the array substrate using an anisotropic conductive film (ACF) through an output lead bonding (OLB) process.

FIG. 1 is a perspective view showing an LCD device according to the related art. FIG. 2 is a magnified view of portion "A" of FIG. 1. As shown in FIGS. 1 and 2, an LCD device includes a liquid crystal panel 10. The liquid crystal panel 10 includes an array substrate 1 and a color filter substrate 3 facing and spaced apart from each other. A liquid crystal layer (not shown) is formed between the array substrate 1 and the color filter substrate 3. A black matrix (not shown) and a color filter layer (not shown) are formed on the color filter substrate 3. In addition, a gate line "GL" and a data line "DL" are formed on the array substrate 1. The gate line GL crosses the data line DL to define a pixel region "P." A thin film transistor (TFT) (not shown) is connected to the gate line GL and the data line DL at each pixel region P.

The LCD device also includes a plurality of driving circuits 7 and 11. Data pads (not shown) and gate pads (not shown) for connection with the driving circuits 7 and 11 are formed at a periphery of the array substrate 1. Each gate pad is connected to a gate link line "GLK" extending from the gate line GL. Each data pad is connected to a data link line "DLK" extending from the data line DL. The driving circuit includes tape carrier packages (TCPs) 9 and printed circuit boards (PCBs) 5. The TCPs 9 are connected to the corresponding gate and data pads. Each TCP 9 includes a film and one of a data driving circuit 7 and a gate driving circuit 11 as an integrated circuit (IC) on the film. The TCPs 9 are also connected to the printed circuit boards (PCBs) 5. In addition, each TCP 9 includes a plurality of output leads 39a and a plurality of input leads 39b on the film. The plurality of output leads 39a correspond to one of the gate pads and the data pads on the array substrate 1. Accordingly, the plurality of output leads 39a is disposed at an opposite side of the plurality of input leads 39b. Even though not shown in FIGS. 1 and 2, the plurality of input leads 39b correspond to PCB pads on each PCB 5. As a result, the PCBs 5 are electrically connected to the array substrate 1 through the TCPs 9 and supply signals to the liquid crystal panel 10.

The plurality of output leads 39a are equally spaced apart from one another. Further, the gate pads and the data pads corresponding to the plurality of output leads 39a are also equally spaced apart from one another so that the gate pads and the data pads correspond one-to-one with the plurality of output leads 39a. Similarly, the plurality of input leads 39b are equally spaced apart from one another, and the PCB pads are equally spaced apart from one another so that the plurality of input leads 39b and the PCB pads are in one-to-one correspondence.

The gate pads, the data pads, and the PCB pads may be divided into groups corresponding to one TCP 9. Two alignment marks are formed at both sides of the plurality of output leads 39a, and two marks are formed at both sides of each group of the gate pads and the data pads. The alignment marks are used to align the plurality of output leads 39a of each TCP 9 and one of the gate pads and the data pads of the liquid crystal panel 10. Similarly, two alignment marks are formed at both sides of the plurality of input leads 39b, and two alignment marks are formed at both sides of each group of the PCB pads to align the plurality of input leads 39b of each TCP 9 and the PCB pads of the PCB 5. For example, two TCP alignment marks 41a and 41b are formed at both sides of the plurality of output leads 39a of each TCP 9. Similarly, two panel alignment marks 42a and 42b are formed at both sides of each group of the gate pads and the data pads of the liquid crystal panel 10.

FIG. 3A is a plan view showing a portion of a TCP of an LCD device according to the related art. FIG. 3B is a plan view showing a portion of a liquid crystal panel of the LCD device according to the related art. Even though FIGS. 3A and 3B show a plurality of output leads of the TCP and a plurality of gate pads of the liquid crystal panel, respectively, FIGS. 3A and 3B may also represent a plurality of input leads of the TCP and a plurality of data pads of the liquid crystal panel, respectively. As shown in FIGS. 3A and 3B, a plurality of output leads 39a are formed in a first portion 45a of a TCP and a plurality of gate (or data) pads 43 are formed in a second portion 45b of a liquid crystal panel. The plurality of output leads 39a correspond one-to-one with the plurality of gate (or data) pads 43. In addition, the plurality of output leads 39a are equally spaced apart from one another. Similarly, the plurality of gate (or data) pads 43 are equally spaced apart from one another. First and second TCP alignment marks 41a and 41b are formed at both sides of the plurality of output leads 39a while first and second panel alignment marks 42a and 42b are formed at both sides of the plurality of gate (or data) pads 43. The first and second TCP alignment marks 41a and 41b correspond to the first and second panel alignment marks 42a and 42b, respectively.

The process for attaching the TCP to the liquid crystal panel will be illustrated hereinafter. The TCP and the liquid crystal panel are disposed using the first and second TCP alignment marks 41a, 41b and the first and second panel alignment marks 42a, 42b such that the plurality of output leads 39a overlap the plurality of gate (or data) pads 43. An anisotropic conductive film (ACF), for example, is interposed between the plurality of output leads 39a and the plurality of gate (or data) pads 43. Next, the TCP is pressed on the liquid crystal panel with heat. However, the first and second TCP alignment marks 41a and 41b may not be properly aligned with the first and second panel alignment marks 42a and 42b due to an accumulated alignment error during the fabrication process. Moreover, since the TCP expands by the pressure and the heat during the attaching process, the mismatch between the TCP alignment marks 41a, 41b and the panel alignment marks 42a, 42b may become worse. As a result, when the TCP and the liquid crystal panel are aligned using the first and second TCP alignment marks 41a, 41b and the first and second panel alignment marks 42a, 42b, the plurality of output leads 39a and the plurality of gate (or data) pads 43 may be misaligned. Similarly, the plurality of input leads 39b (of FIG. 2) and the plurality of PCB pads may be misaligned.

According to recent trends in reducing the cost of materials, the width of TCPs have decreased from about 48 mm to about 35 mm. Accordingly, a gap distance between two adjacent output leads 39a and between two adjacent gate (or data) pads 43 also decreased. As the gap distance decreases, misalignment during the attachment of the TCP and the liquid crystal panel increases. The misalignment causes deterioration in display quality of the LCD device. In addition, since the misaligned TCP and the liquid crystal panel need to be re-attached, fabrication yield is reduced and production cost increases.

SUMMARY OF THE INVENTION

Accordingly, the present invention is directed to a driving circuit and liquid crystal display device including the same that substantially obviates one or more problems due to limitations and disadvantages of the related art.

An object of the present invention is to provide a liquid crystal display device with improved alignment between tape carrier packages and the liquid crystal panel.

Another object of the present invention is to provide a liquid crystal display device with improved picture quality, increased fabrication yield, and reduced production cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a tape carrier package (TCP) includes a film, a plurality of output leads and a plurality of input leads on the film, the plurality of output leads and the plurality of input leads being disposed on different sides, first and second TCP alignment marks arranged on opposing sides of the plurality of output leads, and a third TCP alignment mark at a central portion of the plurality of output leads.

In another aspect, a liquid crystal display (LCD) device includes at least one tape carrier package (TCP), the TCP including a film, a plurality of output leads and a plurality of input leads on the film, the plurality of output leads disposed at different sides of the plurality of input leads, first and second TCP alignment marks at both sides of the plurality of output leads, and a third TCP alignment mark at a central portion of the plurality of output leads, and a liquid crystal panel including a plurality of gate pads and a plurality of data pads, the plurality of output leads of the TCP contacting corresponding ones of the plurality of gate pads and the plurality of data pads, first and second panel alignment marks corresponding to the first and second TCP alignment marks, and a third panel alignment mark corresponding to the third TCP alignment mark, and a printed circuit board (PCB) including a plurality of PCB pads contacting the plurality of input leads, wherein the liquid crystal panel and the printed circuit board are connected to each other through the at least one TCP.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
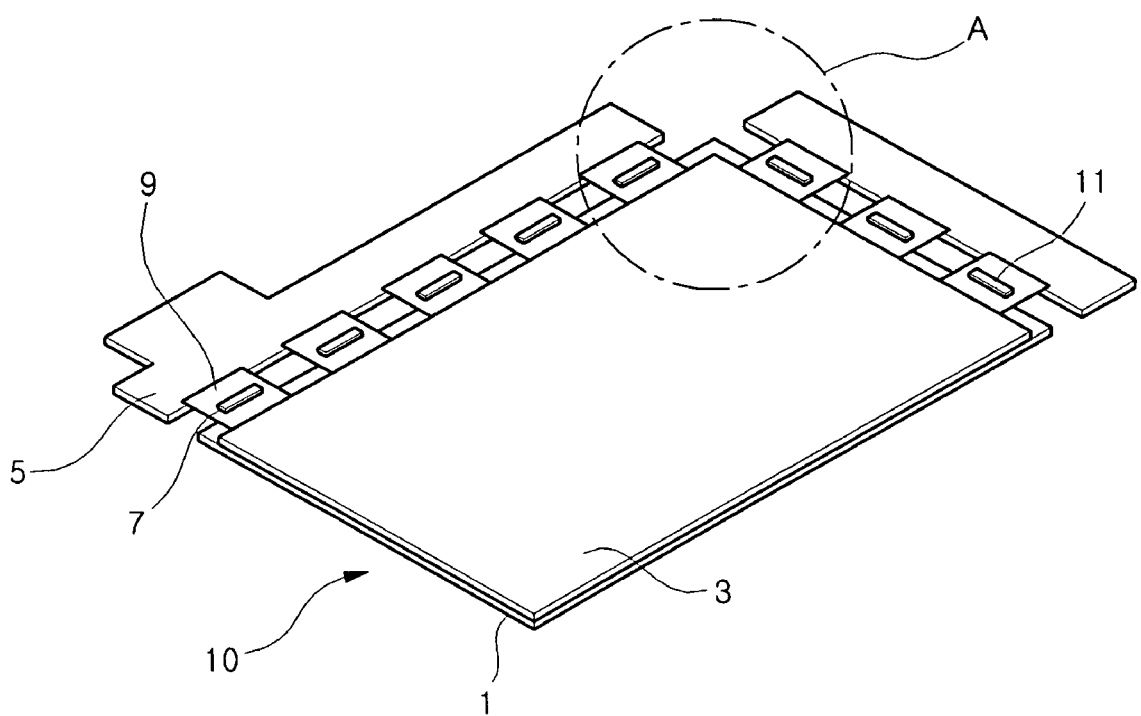
FIG. 1 is a perspective view showing a liquid crystal display device according to the related art.
Figure 2:
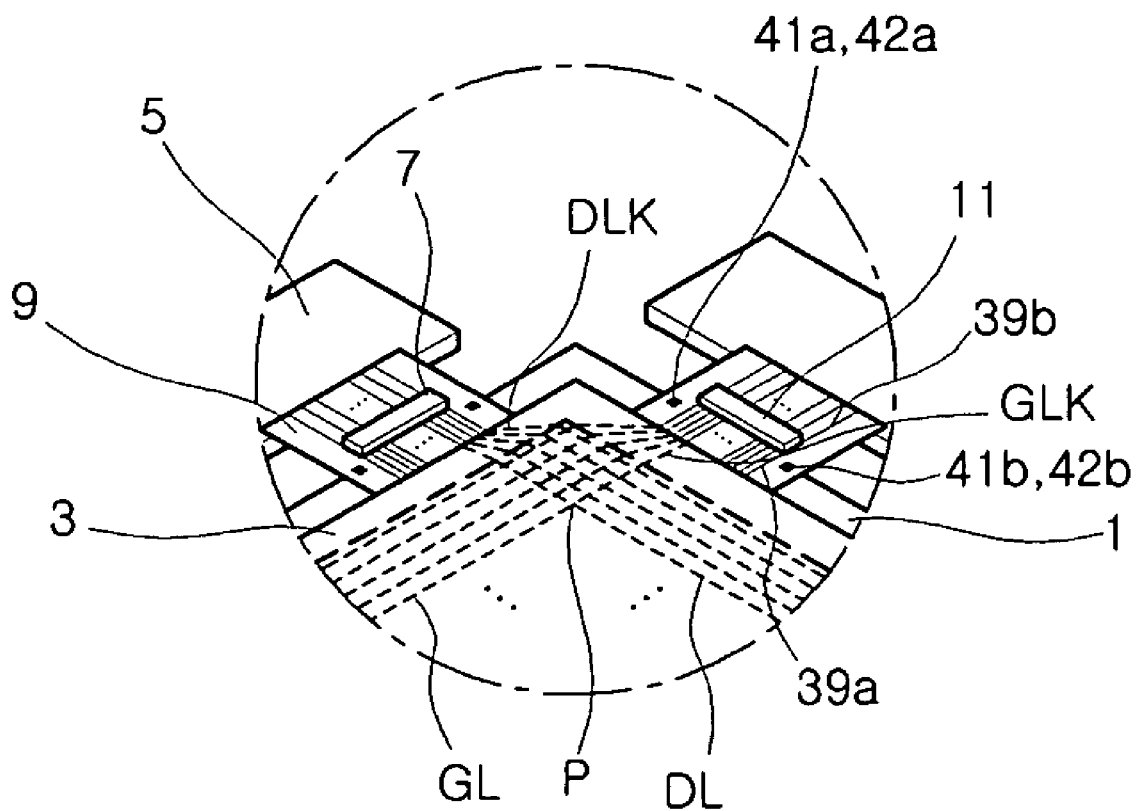
FIG. 2 is a magnified view of portion "A" of FIG. 1.
Figure 3A:
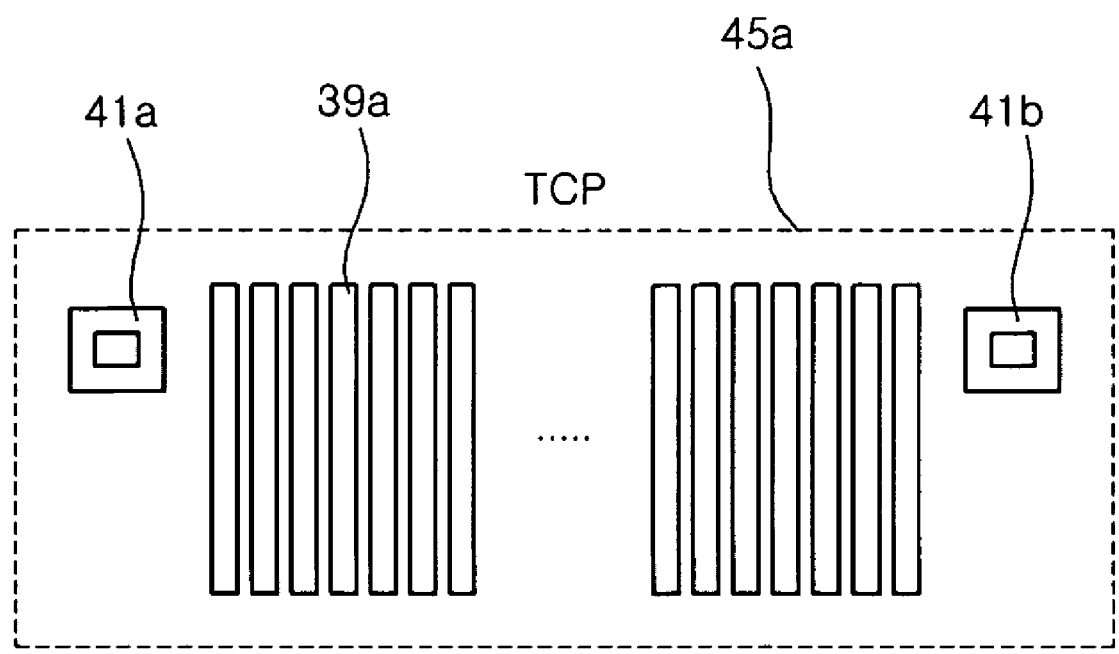
FIG. 3A is a plan view showing a portion of a TCP of a liquid crystal display device according to the related art.
Figure 3B:
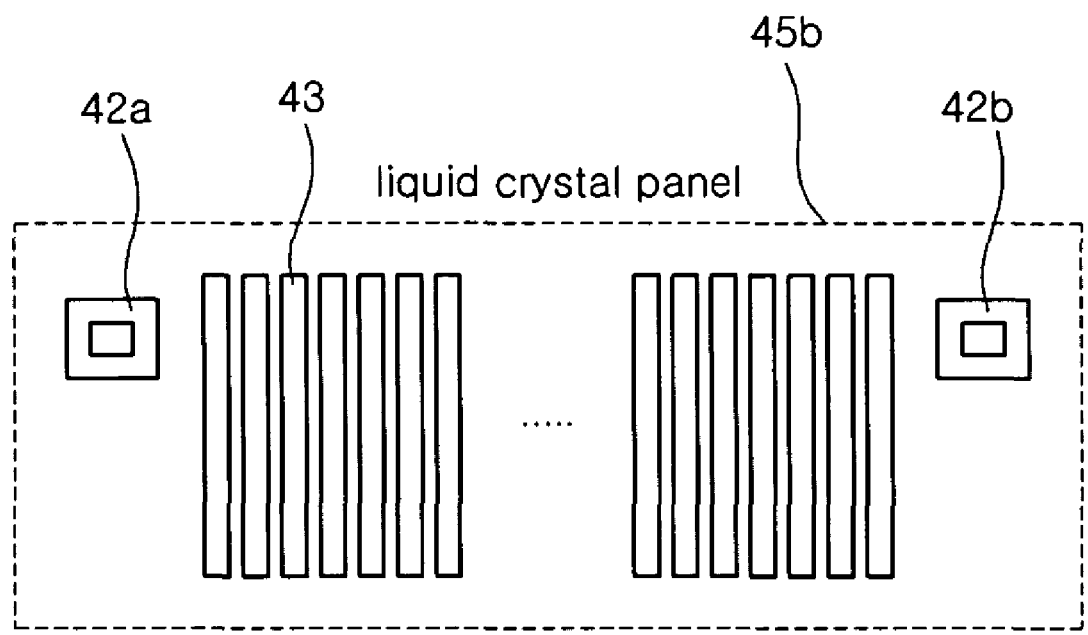
FIG. 3B is a plan view showing a portion of a liquid crystal panel of a liquid crystal display device according to the related art.
Figure 4:
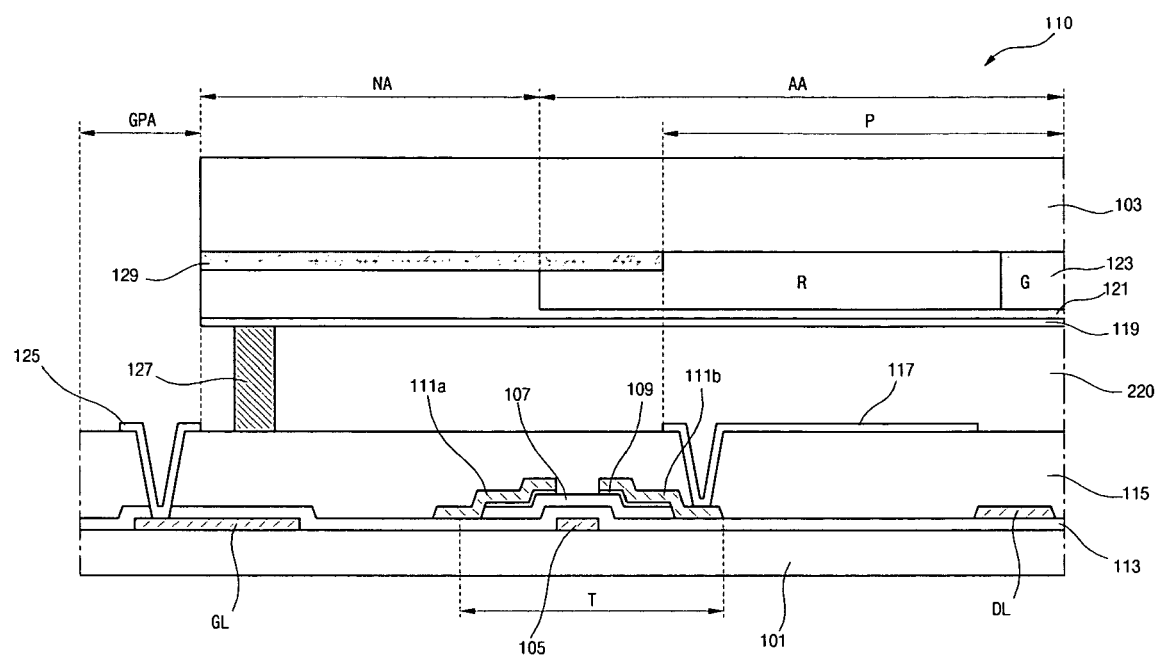
FIG. 4 is a schematic cross-sectional view showing a liquid crystal panel for a liquid crystal display device according to an embodiment of the present invention.

FIG. 4 is a schematic cross-sectional view showing a liquid crystal panel for a liquid crystal display (LCD) device according to an embodiment of the present invention.

As shown in FIG. 4, a liquid crystal panel 110 includes a first substrate 101, a second substrate 103 facing the first substrate 101, and a liquid crystal layer 220 between the first and second substrates 101 and 103. The liquid crystal panel 110 includes a display area "AA" for displaying images and a non-display area "NA" at a periphery of the display area AA. A plurality of gate pads 125 and a plurality of data pads (not shown) are formed in a gate pad portion "GPA" and a data pad portion (not shown), respectively, in the non-display area NA on the first substrate 101. In addition, a gate line "GL" and a gate electrode 105 are formed on the first substrate 101, and a gate insulating layer 113 is formed on the gate line GL and the gate electrode 105. An active layer 107 is formed on the gate insulating layer 113 over the gate electrode 105, and an ohmic contact layer 109 is formed on the active layer 107. Source and drain electrodes 111a and 111b spaced apart from each other are formed on the ohmic contact layer 109. A data line "DL" is formed on the gate insulating layer 113. Even though not shown in FIG. 4, the data line DL crosses the gate line GL to define a pixel region "P" in the display area AA. The gate electrode 105, the active layer 107, the source electrode 111a, and the drain electrode 111b constitute a thin film transistor (TFT) "T." A passivation layer 115 is formed on the source and drain electrodes 111a and 111b, and a pixel electrode 117 contacting the drain electrode 111b is formed on the passivation layer 115. The gate pad 125 and the data pad (not shown) in the non-display area NA are connected to the gate line GL and the data line DL, respectively.

A black matrix 129 is formed on the second substrate 103, and a color filter layer 123 including red (R), green (G), and blue (B) color filters is formed on the black matrix 29 and the second substrate 103. A planarization layer 121 is formed on the color filter layer 123 and the black matrix 129 to reduce a step difference. A common electrode 119 is formed on the planarization layer 121. A seal pattern 127 is formed in the non-display area NA between the first and second substrates 101 and 103. The seal pattern 127 maintains a cell gap between the first and second substrates 101 and 103 and prevents leakage of liquid crystal materials. In addition, the first and second substrates 101 and 103 are attached to each other by the seal pattern 127.

Figure 5:
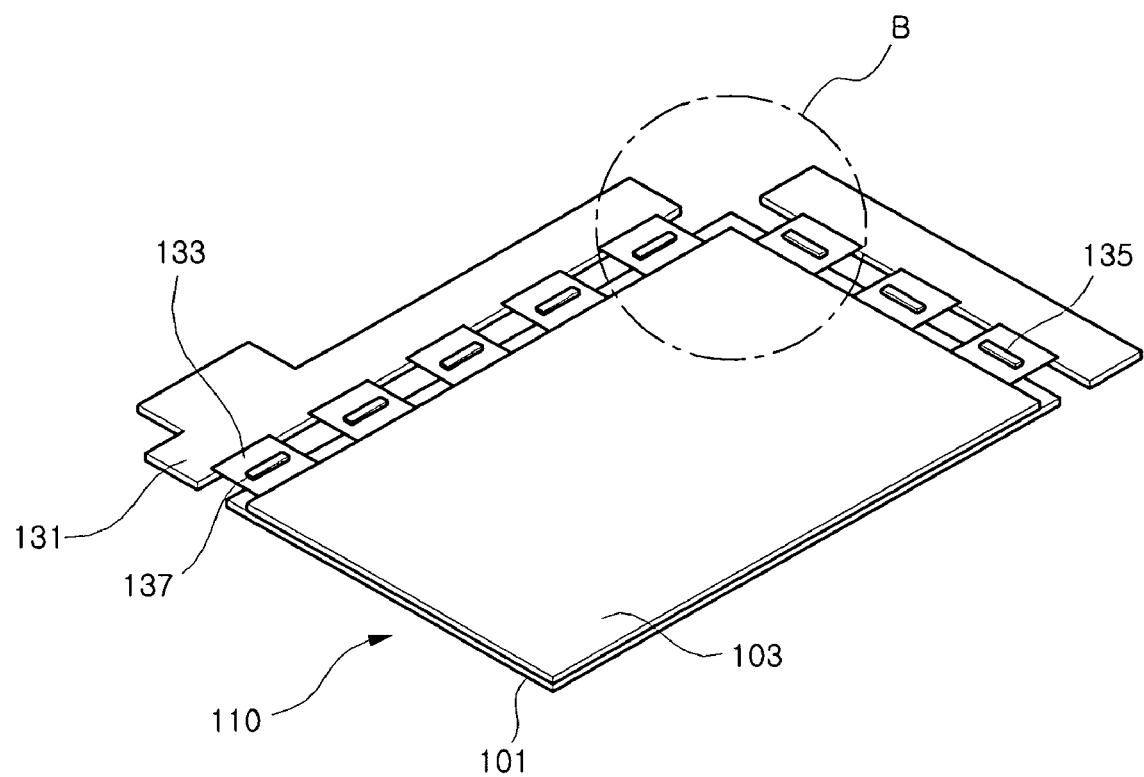
FIG. 5 is a perspective view showing a liquid crystal display device according to an embodiment of the present invention.
Figure 6:
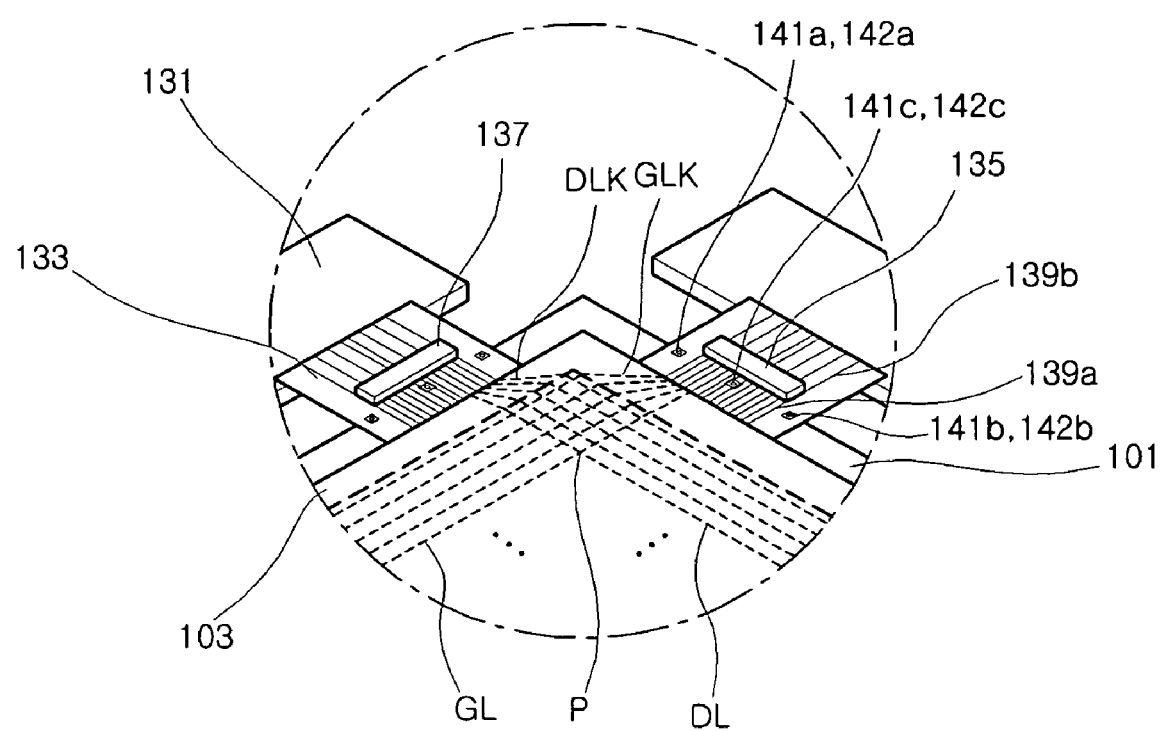
FIG. 6 is a magnified view of portion "B" of FIG. 5.

FIG. 5 is a perspective view showing an LCD device according to an embodiment of the present invention. FIG. 6 is a magnified view of portion "B" of FIG. 5.

As shown in FIGS. 5 and 6, a liquid crystal panel 110 is connected to a driving circuit (135, 137) using a tape automated bonding (TAB) method. A plurality of gate pads (not shown) and a plurality of data pads (not shown) are formed in a non-display area NA on the first substrate 101. Each of the plurality of gate pads is connected to a gate link line "GLK" extending from a gate line GL. Each of the plurality of data pads is connected to a data link line "DLK" extending from a data line DL. A plurality of tape carrier packages (TCPs) 133 are connected to a periphery of the liquid crystal panel 110. Each TCP 133 includes a film and one of a gate driving circuit 135 and a data driving circuit 137 as an integrated circuit (IC) on the film. Each TCP 133 further includes a plurality of output leads 139a and a plurality of input leads 139b on the film. The plurality of output leads 139a is disposed at an opposite side of the plurality of input leads 139b. In addition, a plurality of printed circuit boards (PCBs) 131 is connected to the plurality of TCPs 133. Even though not shown in FIGS. 5 and 6, each PCB 131 includes a plurality of PCB pads. Each output lead 139a contacts one of a corresponding gate pad and data pad, and each input lead 139b contacts one of the plurality of PCB pads. Accordingly, the plurality of PCBs 131 is electrically connected to the liquid crystal panel 110 through the TCPs 133 and supply signals to the liquid crystal panel 110.

The plurality of output leads 139a are equally spaced apart from one another. Further, the plurality of gate pads and the plurality of data pads corresponding to the plurality of output leads 139a are also equally spaced apart from one another so that the plurality of gate pads and the plurality of data pads correspond one-to-one with the plurality of output leads 139a. Similarly, the plurality of input leads 139b are equally spaced apart from one another, and the plurality of PCB pads are equally spaced apart from one another so that the plurality of input leads 139b and the plurality of PCB pads are in one-to-one correspondence. The plurality of gate pads, the plurality of data pads, and the plurality of PCB pads may be divided into groups corresponding to a single TCP 133.

Three alignment marks (141a-141c) are formed at both sides of the plurality of output leads 139a and at a central portion of the plurality of output pads 139a. In addition, three alignment marks (142a-142c) are formed at both sides of each group of the plurality of gate (or data) pads and at a central portion. Accordingly, the plurality of output leads 139a of each TCP 133 are aligned with each group of the plurality of gate pads and the plurality of data pads of the liquid crystal panel 110 using the three alignment marks of each TCP 133 and the three alignment marks of the liquid crystal panel 110.

Similarly, three alignment marks (not shown) are formed at both sides of the plurality of input leads 139b and at a central portion of the plurality of input leads 139b. In addition, three alignment marks (not shown) are formed at both sides of each group of the PCB pads and at a central portion. Accordingly, the plurality of input leads 139b of each TCP 133 are aligned with each group of the plurality of PCB pads of the PCB 131 using the three alignment marks of each TCP 133 and the three alignment marks of the PCB 131. For example, first and second TCP alignment marks 141a and 141b may be formed at both sides of the plurality of output leads 139a and a third TCP alignment mark may be formed at a central portion of the plurality of output leads 139a. Moreover, first and second panel alignment marks 142a and 142b may be formed at both sides of the gate (or data) pads, and a third panel alignment mark 142c may be formed at a central portion of the gate (or data) pads.

Figure 7A:
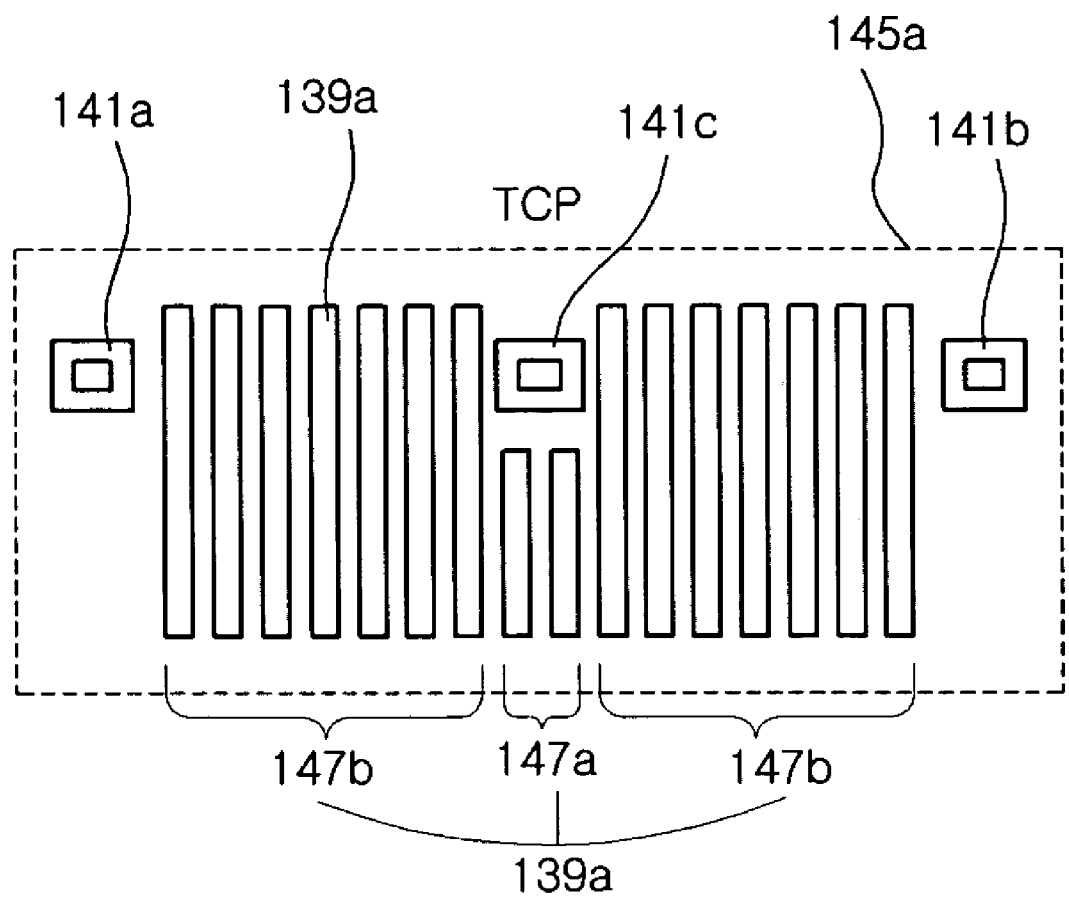
FIG. 7A is a plan view showing a tape carrier package (TCP) of a liquid crystal display device according to an embodiment of the present invention.
Figure 7B:
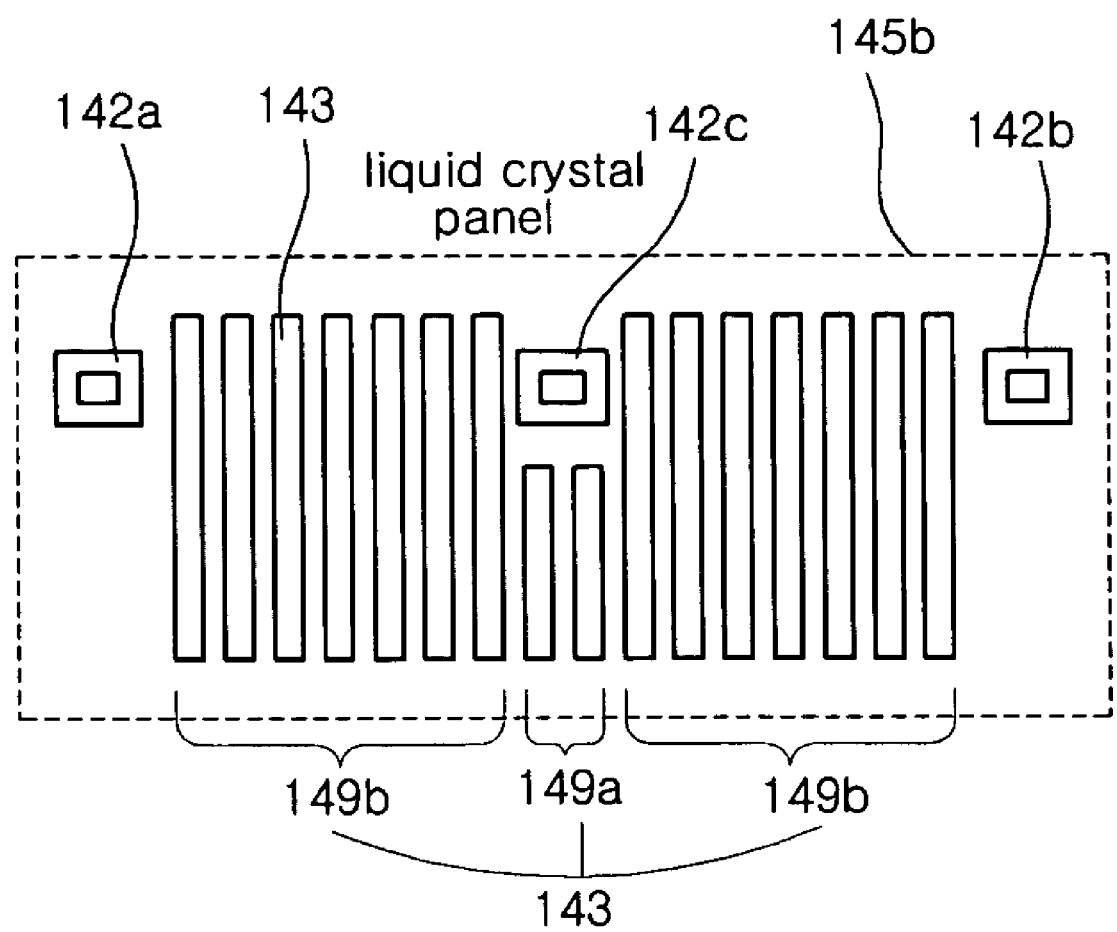
FIG. 7B is a plan view showing a liquid crystal panel for a liquid crystal display device according to an embodiment of the present invention.

FIG. 7A is a plan view showing a portion of a TCP of an LCD device according to an embodiment of the present invention. FIG. 7B is a plan view showing a portion of a liquid crystal panel of an LCD device according to an embodiment of the present invention. Even though FIGS. 7A and 7B show a plurality of output leads of the TCP and a plurality of gate pads of the liquid crystal panel, respectively, FIGS. 7A and 7B may also represent a plurality of input leads of the TCP and a plurality of PCB pads of the PCB, respectively.

As shown in FIGS. 7A and 7B, a plurality of output leads 139a are formed in a first portion 145a of a TCP and a plurality of gate (or data) pads 143 are formed in a second portion 145b of a liquid crystal panel. The plurality of output leads 139a correspond one-to-one with the plurality of gate (or data) pads 143. In addition, the plurality of output leads 139a are substantially equally spaced apart from one another, and the plurality of gate (or data) pads 143 are substantially equally spaced apart from one another. Further, first and second TCP alignment marks 141a and 141b are formed at both sides of the plurality of output leads 139a and a third TCP alignment mark 141c is formed at a central portion of the plurality of output leads 139a. Moreover, first and second panel alignment marks 142a and 142b are formed at both sides of the plurality of gate (or data) pads 143 and a third panel alignment mark 142c is formed at a central portion of the plurality of gate (or data) pads 143. The first, second, and third TCP alignment marks 141a, 141b, and 141c correspond to the first, second, and third panel alignment marks 142a, 142b, and 142c, respectively.

The plurality of output leads 139a may be classified into a first group 147a of output leads and a second group 147b of output leads. The first group 147a of output leads is disposed at the central portion of the plurality of output leads 139a and corresponds to the third TCP alignment mark 141c. The second group 147b of output leads is disposed at both sides of the first group 147a of output leads.

Similarly, the plurality of gate (or data) pads 143 may be classified into a third group 149a of gate (or data) pads and a fourth group 149b of gate (or data) pads. The third group 149a of gate (or data) pads is disposed at the central portion of the plurality of gate (or data) pads 143 and corresponds to the third panel alignment mark 142c. The fourth group 149b of gate (or data) pads is disposed at both sides of the third group 149a of gate (or data) pads.

The output leads of the first group 147a contact the gate (or data) pads of the third group 149a. The output leads of the first group 147a are shorter than the output leads of the second group 147b. Similarly, the gate (or data) pads of the third group 149a are shorter than the gate (or data) pads of the fourth group 149b. Since areas corresponding to the third TCP alignment mark 141c and the third panel alignment mark 142c are utilized for attaching the TCP to the liquid crystal panel, reliability of connection is improved. Moreover, an increase in margins for a pad width and a pad pitch are obtained even when a width of the TCP decreases.

Further, the output leads of the first group 147a may have a narrower width than the output leads of the second group 147b. As a result, even when a number of the output leads increases due to increase of a resolution of the liquid crystal panel and/or a width of the TCP decreases for reducing a material cost, a reliable connection between the TCP and the liquid crystal panel is achieved by the TAB method. In an alternative embodiment, the width of the plurality of output leads 139a may gradually decrease towards the central portion of the plurality of output leads 139a.

Process for attaching the TCP to the liquid crystal panel includes the steps of aligning the TCP and the liquid crystal panel using the first, second, and third TCP alignment marks 141a, 141b, and 141c and the first, second, and third panel alignment marks 142a, 142b, and 142c. As a result, the TCP is positioned over the liquid crystal panel such that the plurality of output leads 139a overlap the plurality of gate (or data) pads 143. An anisotropic conductive film (ACF) is interposed between the plurality of output leads 139a and the plurality of gate pads 143. Next, the TCP is pressed on the liquid crystal panel with heat.

According to the present invention, after the TCP and the liquid crystal panel are aligned using the third TCP alignment mark 141c and the third panel alignment mark 142c, pressure and heat may be applied to the TCP and the liquid crystal panel from the central portion of the plurality of output leads 139a outwards to the outer sides of the plurality of output leads 139a. Since additional third alignment marks 141c and 142c are used, the TCP is aligned more accurately with the liquid crystal panel and the PCB even when the TCP expands by accumulated errors, pressure, and heat. In addition, even though the output leads of the first group 147a have a narrower width than the output leads of the second group 147b, the output leads of the first group 147a contact the gate (or data) pads of the third group 149a more accurately due to the third TCP alignment mark 141c and the third panel alignment mark 142c. The plurality of output leads 139a may be re-aligned with the plurality of gate (or data) pads 143 during the attachment process. As a result, reliability of the attachment process is improved. Moreover, since the output leads of the second group 147b have a wider width than the output leads of the first group 147a, the output leads of the second group 147b contact the gate (or data) pads of the fourth group 149b more accurately even when the TCP expands by accumulated errors, pressure, and heat.

Consequently, in the LCD device according to the present invention, the TCP is attached to the PCB and the liquid crystal panel using a TAB method in accordance with first and second alignment marks at both sides of a plurality of pads and a third alignment mark at a central portion of the plurality of pads. Accordingly, the plurality of output leads of the TCP contact the plurality of gate pads and the plurality of data pads of the liquid crystal panel without misalignment, and the plurality of input leads of the TCP contact the plurality of PCB pads of the PCB without misalignment. Therefore, deterioration in display quality due to the misalignment is prevented. Further, reduction in production yield and increase in fabrication cost for re-attaching the TCP due to misalignment are prevented.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. A tape carrier package (TCP), comprising:
   a film;
   a plurality of output leads and a plurality of input leads on the film, the plurality of output leads and the plurality of input leads being disposed on different sides, wherein the plurality of output leads include outermost output leads and middle output leads;
   first and second TCP alignment marks arranged on opposing sides of the plurality of output leads and corresponding to the outermost output leads;
   a third TCP alignment mark at a central portion of the plurality of output leads and corresponding to the middle output leads;
   fourth and fifth TCP alignment marks on opposing sides of the plurality of input leads; and
   sixth TCP alignment mark at a central portion of the plurality of input leads,
   wherein the first, second and third TCP alignment marks are formed on the film.

2. The tape carrier package according to claim 1, wherein the plurality of output leads includes a first group of output leads at a central portion of the plurality of output leads and a second group of output leads on opposing sides of the first group output leads, each of the output leads of the first group having a narrower width than each of the output leads of the second group.

3. A tape carrier package (TCP), comprising:
   a film;
   a plurality of output leads and a plurality of input leads on the film, the plurality of output leads and the plurality of input leads being disposed on different sides;
   first and second TCP alignment marks arranged on opposing sides of the plurality of output leads;
   a third TCP alignment mark at a central portion of the plurality of output leads;
   fourth and fifth TCP alignment marks on opposing sides of the plurality of input leads; and
   sixth TCP alignment mark at a central portion of the plurality of input leads,
   wherein the plurality of output leads includes a first group of output leads at a central portion of the plurality of output leads and a second group of output leads on opposing sides of the first group output leads, each of the output leads of the first group having a narrower width than each of the output leads of the second group, and wherein each of the output leads of the first group has a shorter length than each of the output leads of the second group.

4. A tape carrier package (TCP), comprising:

a film;

a plurality of output leads and a plurality of input leads on the film, the plurality of output leads and the plurality of input leads being disposed on different sides;

first and second TCP alignment marks arranged on opposing sides of the plurality of output leads;

a third TCP alignment mark at a central portion of the plurality of output leads;

fourth and fifth TCP alignment marks on opposing sides of the plurality of input leads; and sixth TCP alignment mark at a central portion of the plurality of input leads, wherein a width of the plurality of output leads gradually decreases from the outer sides of the plurality of output leads to the central portion of the plurality of output leads.

5. The tape carrier package according to claim 1, further comprising a driving integrated circuit (IC) connected to the plurality of output leads and the plurality of input leads.

\* \* \* \* \*